(12) United States Patent
Yoshida

(10) Patent No.: US 7,184,227 B2
(45) Date of Patent: Feb. 27, 2007

(54) OPTICAL UNIT, EXPOSURE UNIT AND OPTICAL DEVICES

(75) Inventor: Setsuo Yoshida, Saitama (JP)

(73) Assignee: Canon Kabushiki Kiasha, Tokyo (JP)

( * ) Notice: Subject to any disclaimer, the term of this patent is extended or adjusted under 35 U.S.C. 154(b) by 0 days.

(21) Appl. No.: 11/398,592

(22) Filed: Apr. 6, 2006

(65) Prior Publication Data
US 2006/0176585 A1    Aug. 10, 2006

Related U.S. Application Data

(62) Division of application No. 10/281,182, filed on Oct. 28, 2002, now Pat. No. 7,050,247.

(30) Foreign Application Priority Data
Nov. 20, 2001   (JP)   ............................ 2001-354891

(51) Int. Cl.
*G02B 7/02* (2006.01)
(52) U.S. Cl. .................. 359/818; 359/811; 359/819; 359/822

(58) Field of Classification Search ............... 359/819
See application file for complete search history.

(56) References Cited

U.S. PATENT DOCUMENTS

| | | | |
|---|---|---|---|
| 5,249,082 | A | 9/1993 | Newman |
| 5,973,333 | A | 10/1999 | Nakasuji et al. |
| 6,400,516 | B1 | 6/2002 | Spinali |
| 6,525,888 | B2 | 2/2003 | Schletter |
| 6,791,771 | B2 * | 9/2004 | Kanematsu et al. ........ 359/820 |
| 6,878,042 | B2 * | 4/2005 | Oshino ...................... 451/41 |

* cited by examiner

*Primary Examiner*—Jack Dinh
(74) *Attorney, Agent, or Firm*—Fitzpatrick, Cella, Harper & Scinto

(57) ABSTRACT

In an optical unit having a holding structure which brings a junk ring or the like into contact with an optical surface of a lens, the optical surface suffers from a serious elastic deformation leading to deterioration of optical performance. Upon holding the lens, therefore, a face other than the optical surface is provided on the lens so that the lens is held by applying a force to the face from element holding members.

5 Claims, 8 Drawing Sheets

OPTICAL UNIT, EXPOSURE UNIT AND OPTICAL DEVICES

This application is a division of Application Ser. No. 10/281,182 filed Oct. 28, 2002, U.S. Pat. No. 7,050,347 B2.

BACKGROUND OF THE INVENTION

1. Field of the Invention

The present invention relates to an optical unit used in a projection optical system in a semiconductor exposure unit, an image-pickup device such as a video camera or a still camera, or other optical device.

2. Description of the Related Art

The method of pressing down a lens by means of a ring-shaped member known as a junk ring, as shown in FIG. 7, is conventionally used commonly for the purpose of holding a lens, an optical element, in a lens enclosure of an optical device.

In FIG. 7, a portion engaging with the outer periphery of a lens 51 and a supporting section 53a supporting the periphery of the optical surface of the lens 51 are formed along the inside diameter of a lens holding member 53 fixed within the lens enclosure 52. The optical surface on the opposite side of the lens 51 set on the lens holding member 53 is pressed down by means of a ring-shaped junk ring 54 screwed into a threaded portion formed on the inner periphery of the lens holding member 53.

The lens 51 is thus held in the lens holding member 53 by means of the junk ring 54 and the supporting section 53a of the lend holding member 53.

There is also available a method, as shown in FIG. 8, of arranging presser plates 55 at a plurality of positions in the circumferential direction with the optical axis of the lens 51 as the center, and securing the same to the lens holding member 53 with screws 56.

However, the conventional lens holding methods shown in FIGS. 7 and 8 as described above, have problems in that, because the lens holding member 53, the junk ring 54 or the presser plate 55 is in contact with the optical surface of the lens 51 under a prescribed pressure, the optical surface of the lens 51 deforms and optical performance such as aberration of the optical system including the lens 51 are deteriorated.

In addition, since the amount of elastic deformation of the lens 51 varies with the status of tightening of the junk ring 54 or the status of tightening of the screw 56 securing the presser plate 55, another problem is encountered in that optical performance of the optical system varies with the manner of assembly.

The lens 51 is often made of a glass material, and the lens holding member 53, the junk ring 54 and the presser plate 55 are made of a metal material in many cases. In this case, because of the difference in linear expansion coefficient, a change in temperature causes a difference in the amount of expansion/shrinkage resulting from the change in temperature between the lens 51 and the other members. This in turn causes a change in the amount of pressing (or the pressing force) of the junk ring 54 or the presser plate 55 against the lens 51, leading to a change in the amount of elastic deformation of the optical surface of the lens 51. This poses another problem of a change in the optical performance of the optical system caused by a change in temperature.

SUMMARY OF THE INVENTION

An object of the present invention is therefore to provide an optical unit which permits inhibition of deterioration of optical performance caused by the holding structure of optical elements or a change in temperature.

To achieve the above-mentioned object, a first aspect of the present invention provides an optical unit comprising an optical element; the optical element having at least one holding surface different from an optical surface of the optical element; and an element holding member holding the optical element; the element holding member holding the optical element by being in contact with that at least one holding surface.

In an optical unit provided by a second aspect of the invention, at least one holding surface is substantially in parallel with an optical axis of the optical element; and the element holding member holds the optical element by being in contact with that at least one holding surface from a circumferential direction around the optical axis.

In an optical unit provided by a third aspect of the invention, the optical element has a pair of holding surfaces substantially in parallel with the optical axis direction of the optical element and substantially in parallel with each other; and the element holding member holds the optical element by being in contact with the pair of holding surfaces.

In an optical unit provided by the fourth aspect of the invention, the optical surface allows transmission of light.

An optical unit provided by a fifth aspect of the invention further comprises a travel blocking means which is in contact with the peripheral portion of the optical surface and blocks travel of the optical element in the optical axis direction.

In an optical unit provided by a sixth aspect of the invention, at least one holding surface which is substantially in parallel with a direction perpendicular to the optical axis of the optical element is formed; and the element holding member holds the optical element by being in contact with the holding surface from the direction of the optical axis.

In an optical unit provided by a seventh aspect of the invention, that optical element has a pair of holding surfaces substantially in parallel with a direction perpendicular to the optical axis of the optical element and substantially in parallel with each other; and the element holding member holds the optical element by being in contact with the pair of holding surfaces.

In an optical unit provided by an eighth aspect of the invention, the optical element is a lens of which both sides in the optical axis direction form optical surfaces.

In an optical unit provided by a ninth aspect of the invention, the optical element has a hole substantially in parallel with a plane perpendicular to the optical axis of the optical element; and the element holding member holds the optical element by being in contact with the inner surface of the hole from the optical axis direction.

A tenth aspect of the invention provides an optical apparatus which comprises an optical unit according the first aspect of the invention.

In an apparatus provided by an eleventh aspect of the invention, the optical apparatus is an exposure unit having a lighting optical system illuminating a pattern with light from a light source; and a projection optical system which guides the light from the pattern to an object of exposure; and the lighting optical system and/or projection optical system have an optical unit according to the first aspect of the invention.

A manufacturing method of a device provided by the twelfth aspect of the invention comprises an exposure step for exposing an object of exposure in an exposure apparatus according to the eleventh aspect of the invention; and a developing step for developing the object of exposure.

A thirteenth aspect of the invention provides an optical unit comprising an optical element; and element holding means holding the optical element; the element holding means holding the optical element by imparting a force on a first straight line in a skew relationship with the optical axis of the optical element to the optical element.

In an optical unit provided by the fourteenth aspect of the invention, the first straight line is substantially in parallel with a plane perpendicular to the optical axis of the optical element.

In an optical unit provided by the fifteenth aspect of the invention, the first straight line is a tangent line for a circle conceived with the optical axis of the optical element as a center.

In an optical unit provided by the sixteenth aspect of the invention, the element holding means is in contact with a contact surface provided on the optical element; and the contact surface is different from the optical surface provided on the optical element.

In an optical unit provided by a seventeenth aspect of the invention, the optical surface allows transmission of light.

An optical apparatus provided by an eighteenth aspect of the invention comprises an optical unit according to the thirteenth aspect.

In an apparatus provided by the nineteenth aspect of the invention, the optical apparatus is an exposure unit; the exposure apparatus comprises a lighting optical system; and a projection optical system guiding the light from the pattern to an object of exposure; the lighting optical system and/or the projection optical system have an optical unit according to the thirteenth aspect of the invention.

A manufacturing method provided by the twentieth aspect of the invention comprises an exposure step for exposing an object of exposure in an exposure unit according to the nineteenth aspect; and a developing step for developing the object of exposure.

Further objects, features and advantages of the present invention will become apparent from the following description of the preferred embodiments with reference to the attached drawings.

DESCRIPTION OF THE PREFERRED EMBODIMENTS

First Embodiment

Figure 1:
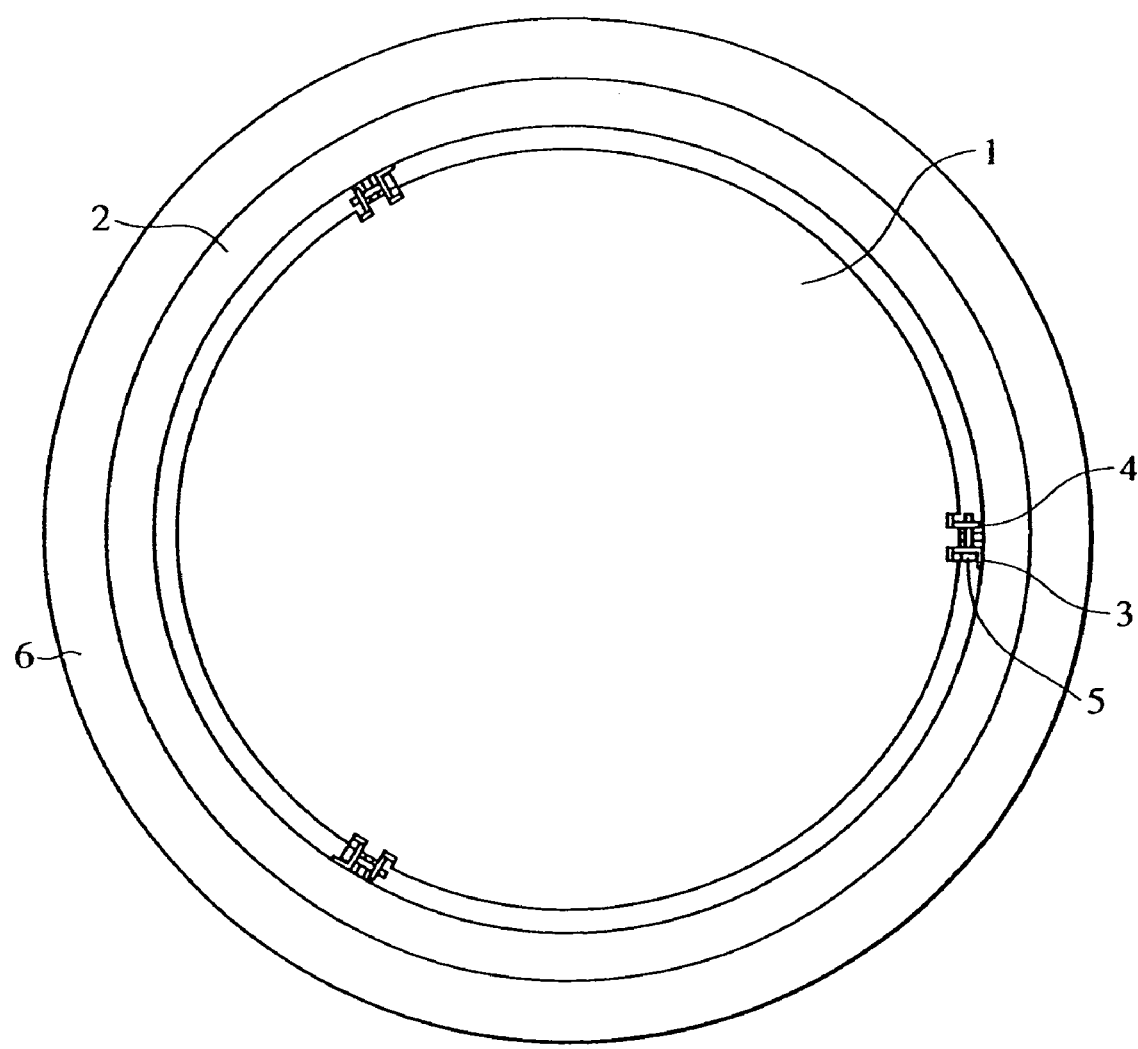
FIG. 1 illustrates the optical unit representing a first embodiment of the present invention as viewed from the optical axis direction.
Figure 2:
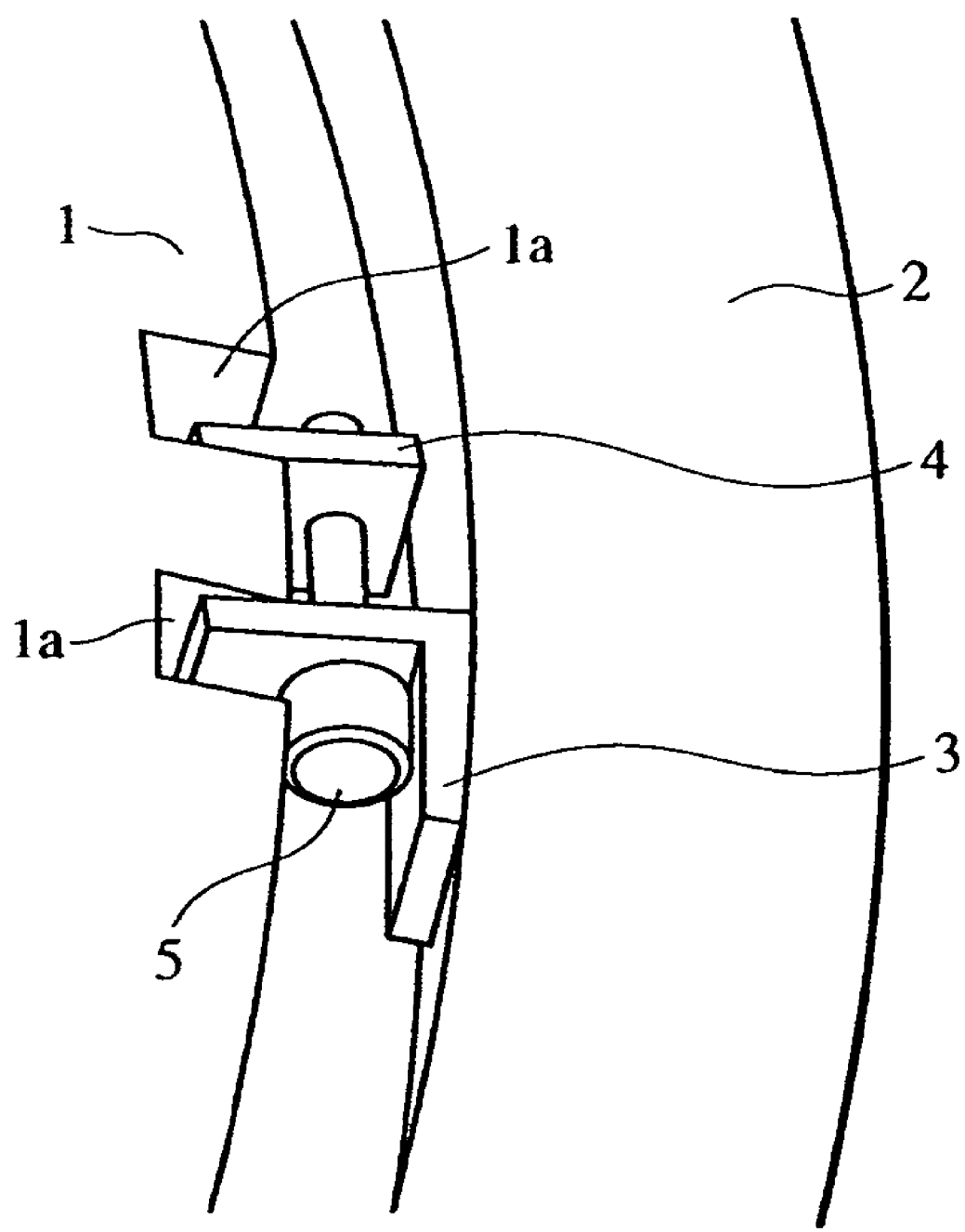
FIG. 2 is a partial enlarged view of the optical unit of the first embodiment of the invention.
Figure 3:
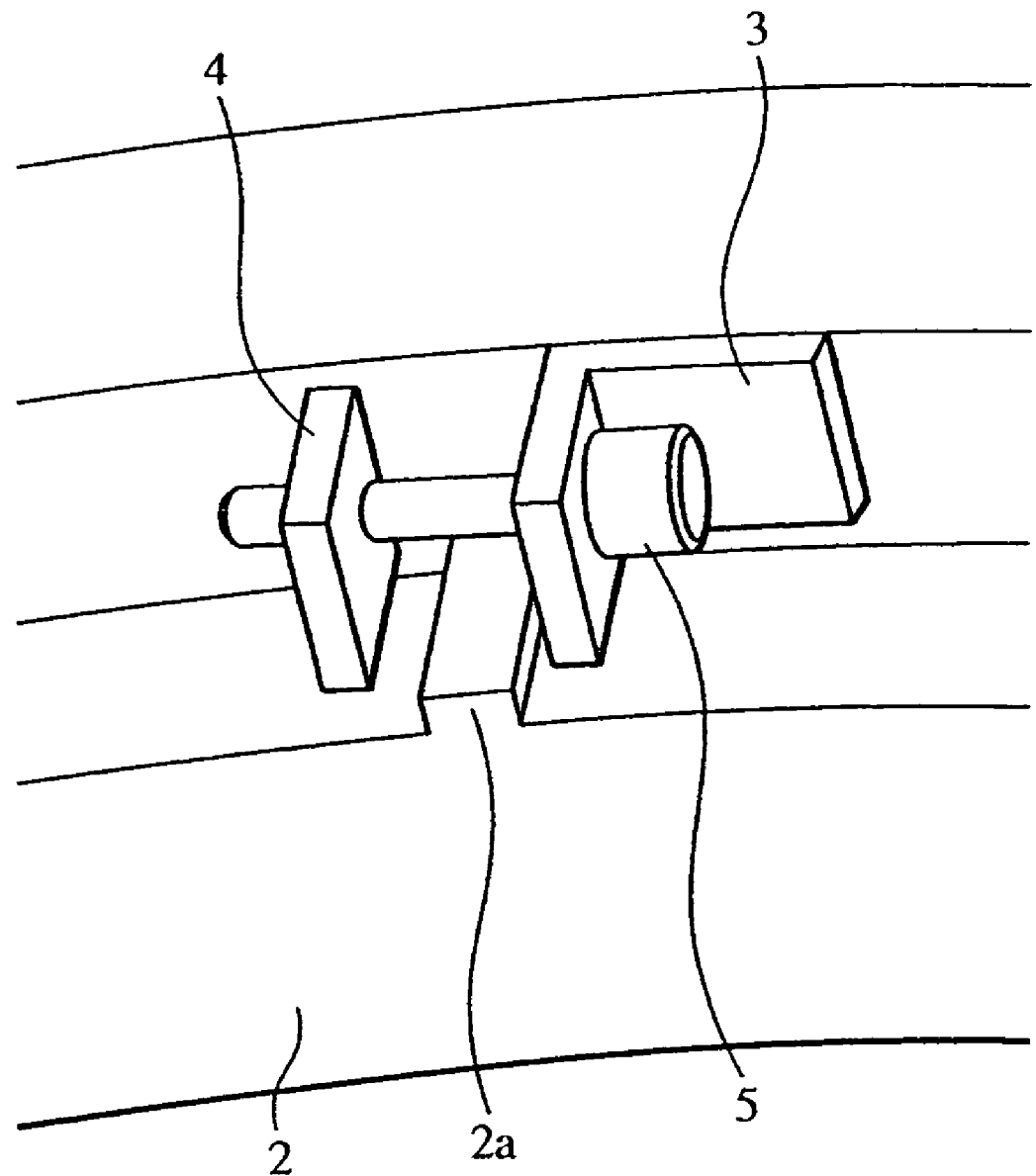
FIG. 3 is an enlarged view of the optical unit of the first embodiment of the invention (prior to holding the lens)

FIGS. 1 to 3 illustrate an optical unit representing a first embodiment of the present invention. FIG. 1 is a whole view of the optical unit as viewed from the optical axis direction; FIG. 2 is a partial enlarged view of the optical unit; and FIG. 3 is an enlarged view of the optical unit prior to holding a lens.

In these drawings, reference numeral 1 represents a lens (optical element) composing the optical unit, and two grooves 1a are formed in parallel at a prescribed interval at three positions in the circumferential direction of the periphery outside an optically effective diameter of this lens 1. As a result, a convex portion remains between the two grooves 1a, and a pair of holding surfaces, which are surfaces different from the optical surface and are substantially in parallel with the optical axis direction and substantially in parallel with each other, are formed on both ends in the circumferential direction of the convex portion.

Reference numeral 2 represents a ring-shaped lens holding base. Supporting projections 2a projecting in the optical axis direction are provided at three positions in the circumferential direction on the inner periphery of the lens holding base 2.

Reference numeral 3 represents holding fixtures formed into an L shape, and are integrally attached at three positions in the circumferential direction on the inner periphery of the lens holding base 2; 4 represents a holding fixture, connected to the above-mentioned L-shaped holding fixture 3 with bolts 5.

The lens holding base 2, the holding fixtures 3 and 4, and the bolts 5 form an element holding member as recited in the claims.

Reference numeral 6 represents an enclosure serving as a main body of the optical unit of this embodiment, and integrally holds the lens holding base 2.

In the optical unit having the above-mentioned configuration, the lens 1 is arranged on the top surfaces of the supporting projections at the three positions provided on the lens holding base 2 held by the enclosure 6, with their lower peripheries of the optical surfaces in contact therewith. As a result, travel of the lens 1 in the optical axis direction upon and after assembly is prevented.

The surface of the L-shaped holding fixture 3 is in contact with one of the pair of holding surfaces provided at the three positions in the circumferential direction of the lens 1, and the holding fixture 4 is in contact with the other holding surface. In this state, by tightening the bolts 5 connecting the two holding fixtures 3 and 4 in a direction of narrowing the interval between the two holding fixtures 3 and 4, the two holding surfaces (i.e., the convex portion between the grooves 1a) are held between the two holding fixtures 3 and 4, and the lens 1 is held by the frictional force between the holding surfaces and the two holding fixtures 3 and 4.

Members for increasing the frictional force may be held between the holding surfaces and the two holding fixtures 3 and 4.

The lens 1 is thus positioned and held relative to the lens holding base (i.e., the enclosure 6) under the effect of the circumferential force (holding force) from the two holding fixtures 3 and 4.

In the conventional holding method based on a junk ring or a presser plate, the pressing-holding force in a direction perpendicular to the optical surface of the lens acts on the optical surface itself, and this holding force causes a serious deformation of the optical surface.

In this embodiment, in contrast, the holding force acts in the lens circumferential direction (a direction in parallel with the optical surface) on the holding surface substantially perpendicular to the optical surface of the lens 1. Deformation of the optical surface caused by the holding force is considerably smaller than in the conventional art. In this embodiment, the supporting projections 2a are in contact with the peripheral surface of the lower surface (optical surface) of the lens 1, where a contact force only sufficient to support the weight of the lens 1 acts. The force is therefore smaller as compared with that in the conventional case where the junk ring or the presser plate presses down the optical surface.

According to this embodiment, therefore, deterioration of optical performance resulting from elastic deformation of the optical surface of the lens, caused by the conventional holding structure itself using a junk ring or a presser plate is solved to a large extent.

Even when there occurs a difference in the amount of expansion/shrinkage upon a change in temperature as a result of dispersion of the degree of tightening of the bolts 5, and by manufacturing the lens 1 from a glass material and manufacturing the element holding member comprising the holding fixtures 3 and 4, the bolts 5, and the lens holding base 2 from a metal material, the effect on the optical surface is smaller than in the conventional holding methods.

Dispersion or change in optical performance caused by the state of assembly or a change in temperature, which is a problem in the conventional holding method, therefore hardly occurs.

According to this embodiment, as described above, there is available an optical unit which is less affected by deterioration of optical performance caused by the holding structure itself of the lens 1, the state of assembly thereof or a change in temperature, and stably gives high optical performance.

A case where supporting projections 2a are provided on the lens holding base 2 is covered by this embodiment. The lens 1 may be held only by pinching by the holding fixtures 3 and 4 without providing supporting projections 2a.

Second Embodiment

Figure 4:
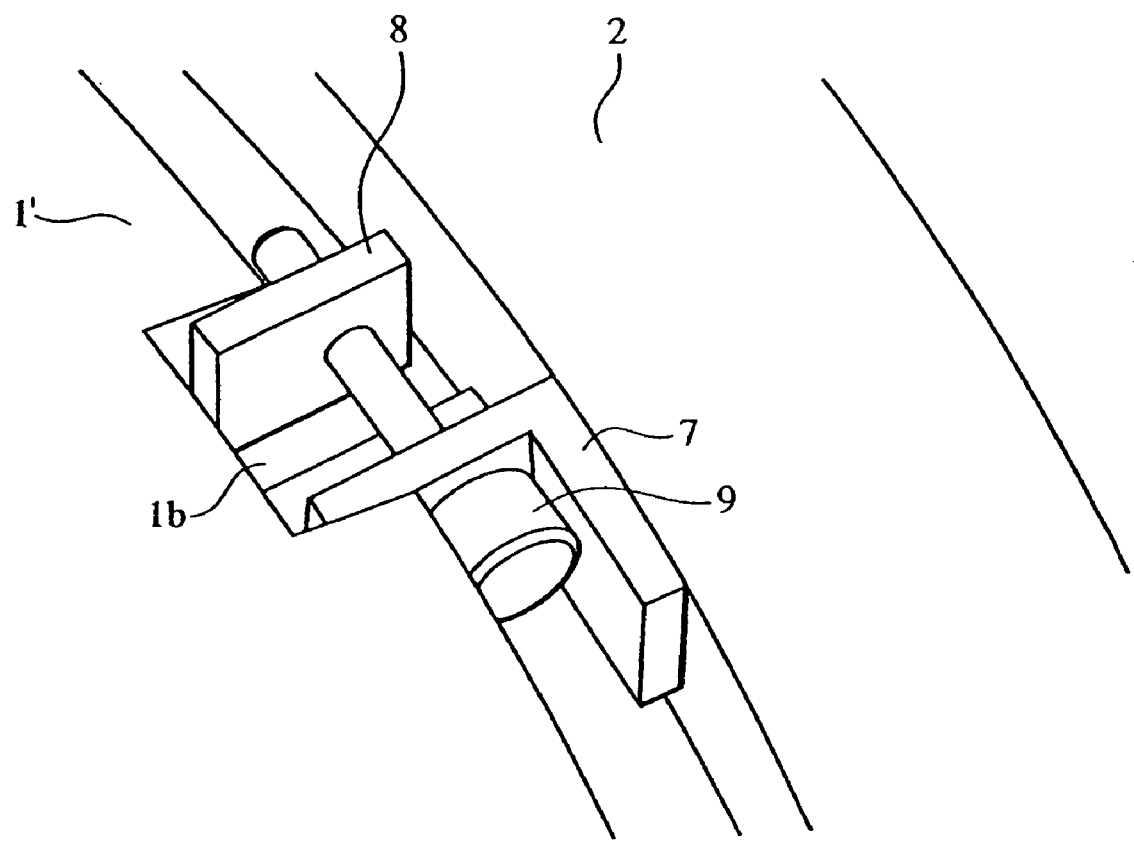
FIG. 4 illustrates an optical unit representing a second embodiment of the invention as viewed from the optical axis direction.

FIG. 4 illustrates an optical unit representing a second embodiment of the present invention. FIG. 4 is a partially enlarged view of the optical unit of the second embodiment of the invention. In this embodiment, the same component elements as those in the first embodiment are represented by the same reference numerals as in the first embodiment.

In the second embodiment, grooves 1b are formed at three positions in the circumferential direction of the periphery outside the optically effective diameter of the lens 1'. A pair of holding surfaces which are surfaces different from the optical surface and are substantially in parallel with the optical axis direction and substantially in parallel with each other.

A surface of an L-shaped holding fixture 7 integrally attached to the lens holding member 2 is in contact with one of the pair of holding surfaces, and another holding fixture 8 is in contact with the other holding surface. In this state, by turning a bolt 9 connecting both holding fixtures 7 and 8 in a direction increasing the distance between the holding fixtures 7 and 8, the holding fixtures 7 and 8 are pressed against the holding surfaces, respectively, and the lens 1' is held by the frictional force between the holding surfaces and the holding fixtures 7 and 8.

In this embodiment, a holding force acts in the lens circumferential direction on the holding surface substantially perpendicular to the optical surface of the lens 1'. Deformation of the optical surface caused by the holding force is considerably smaller than in the conventional art.

According to this embodiment, therefore, deterioration of optical performance resulting from elastic deformation of the lens optical surface caused by the conventional holding structure itself using a junk ring or a presser plate is avoided to a considerable extent.

Even when there is dispersion in the state of tightening of the bolts 9, or even when a difference in the amount of expansion/shrinkage caused by a change in temperature between the lens 1' made of a glass material and the element holding member, comprising the holding fixtures 7 and 8, the bolt 9 and the lens holding base, made of a metal material results in a change in the holding force, the effect on the optical surface is slighter than that in the conventional holding method.

Optical performance therefore hardly suffers from dispersion or a change as a result of a state of assembly or a change in temperature.

The aforementioned first and second embodiments have a common feature. The common feature is that the holding fixtures (element holding means) 3 and 4 apply a force on a straight line having a "skew" relationship with the optical axis not shown of the lens (optical element) to the lens 1. The lens 1 is held by this force on the straight line having the "skew" relationship with the optical axis. For example, in the first embodiment (see FIG. 2), the projection produced by providing two notches on the lens 1 is held by the holding fixtures 3 and 4 in between: the straight line subjected to this pinching force and the optical axis of the lens 1 is in the "skew" relationship. In the second embodiment (see FIG. 4), the lens 1' is held by a force applied by the holding fixtures 7 and 8, by providing a notch on the lens 1', and pressing into contact the holding fixtures 7 and 8 to the resultant two surfaces substantially in parallel with the optical axis. In this case, the straight line receiving the force applied by the holding fixtures 7 and 8 to the lens 1' and the optical axis of the lens 1' is in the "skew" relationship. The fact that, in order to hold the lens (optical element) 1', the straight line receiving the force applied by the holding fixtures (element holding means) to the lens and the optical axis of the lens 1' is in the "skew" relationship is the feature common to the first and second embodiments.

Third Embodiment

Figure 5A:
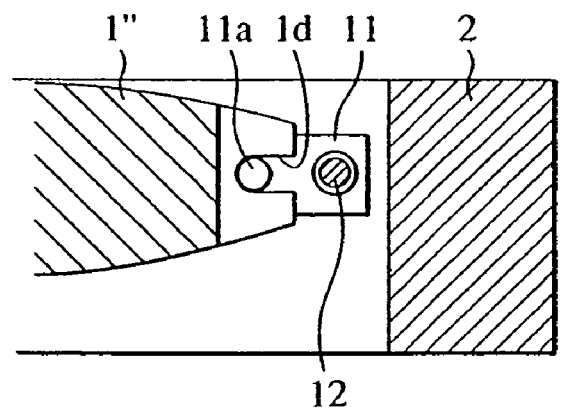
FIGS. 5A, 5B, and 5C are partial enlarged views of an optical unit representing a third embodiment of the invention.
Figure 5B:
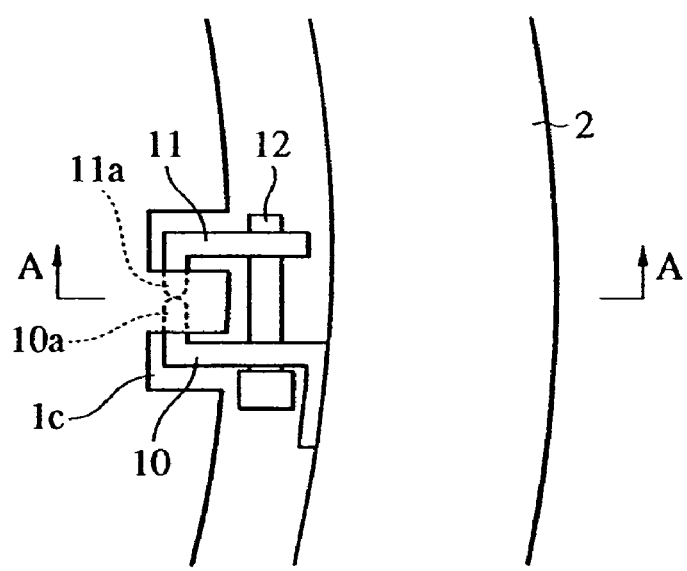
Figure 5C:
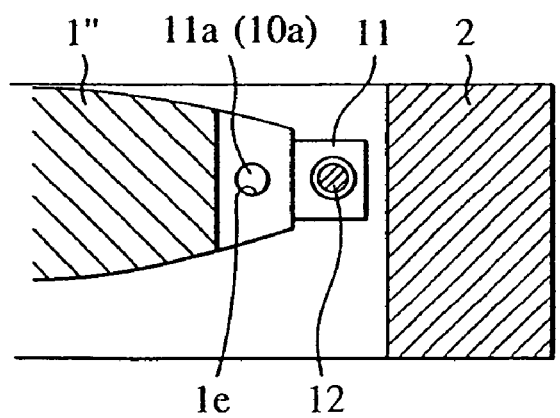

FIGS. 5A, 5B, and 5C illustrate an optical unit representing a third embodiment of the present invention. FIGS. 5A, 5B, and 5C are partially enlarged views of the optical unit: 5B is a perspective view in the optical axis direction; and 5A is a sectional view cut along the line A—A. In this embodiment, the same component elements as those in the first embodiment are represented by the same reference numerals as in the first embodiment.

In this embodiment, two grooves 1c are formed at a prescribed distance therebetween in parallel with each other at three positions in the circumferential direction on the periphery outside the optically effective diameter of a lens 1". A convex portion remains between the two grooves 1c. A groove 1d is formed at the thickness center (optical axis) of this convex portion. As a result, a pair of holding surfaces substantially in parallel with a direction perpendicular to the optical axis and in parallel with each other, which form surfaces different from the optical surface, are formed on the two inner surfaces opposite to each other in the groove 1d.

A holding fixture 10 having a projection 10a inside the leading end thereof is integrally provided at each of the three positions in the circumferential direction on the inner periphery of the lens holding member 2. A holder 11 having a projection 11a inside the leading end thereof is connected by a bolt 12 to the holding fixture 10.

This embodiment is based on a process of arranging the lens 1" at a prescribed position on the inner periphery of the lens holding base 2; then, inserting the projections 10a and 11a of the holding fixtures 10 and 11 between the pair of holding surfaces (groove 1d) to bring the projections 10a and 11a into contact with at least the upper holding surface; tightening the bolt 12 until the leading ends of the projections 10a and 11a come into contact; and injecting an adhesion into gaps between the pair of holding surfaces and the projections 10a and 11a and between the sides of the holding fixtures 10 and 11 and the side of the convex portion having the groove 1c formed thereon to harden the same, thereby preventing a play o the lens 1" from occurring.

According to this embodiment, while a force supporting the weight of the lens exerts the effect between the projections 10a and 11a of the holding fixtures 10 and 11 and the holding surfaces, no other holding force acts thereon. According to this embodiment, therefore, the effect on the optical surface of the conventional holding structure itself using the junk ring or the presser plate, the status of tightening of the bolt 12, or the difference in the amount of expansion/shrinkage of the members upon occurrence of a change in temperature can be minimized as compared with the conventional holding method.

The present embodiment has covered a case where the groove 1d is formed on the convex portion of the lens 1". In place of the groove 1d, a hole 1e substantially in parallel with a plane perpendicular to the optical axis of the lens 1" may be formed as shown in FIG. 5C, and the projections 10a and 11a of the holding fixtures 10 and 11 may be brought into contact with the inner surface of the hole 1e from the optical axis direction.

Fourth Embodiment

Figure 6:
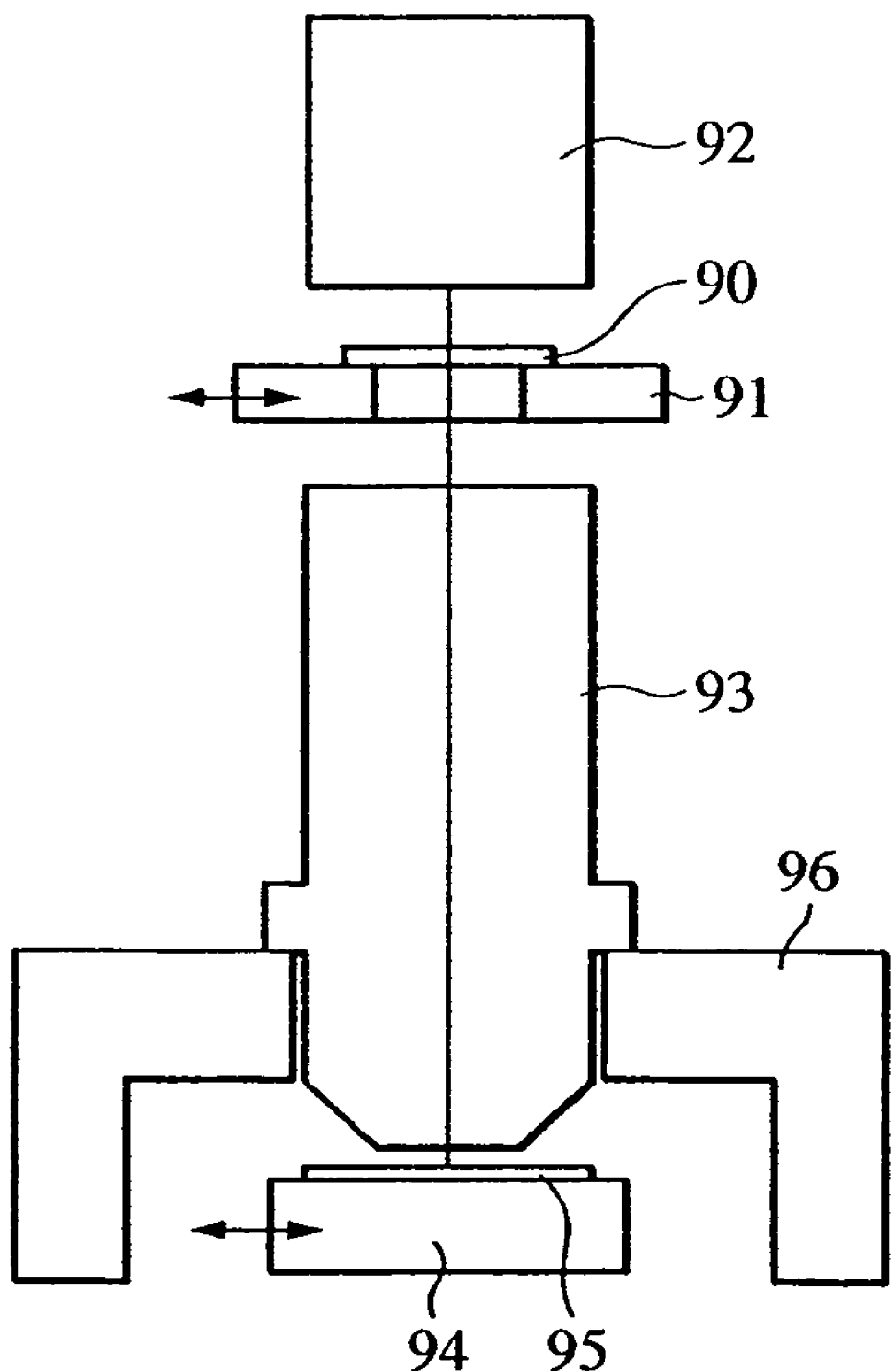
FIG. 6 is a schematic configuration diagram of exposure units using the optical units of the first to third embodiments of the invention.
Figure 7:
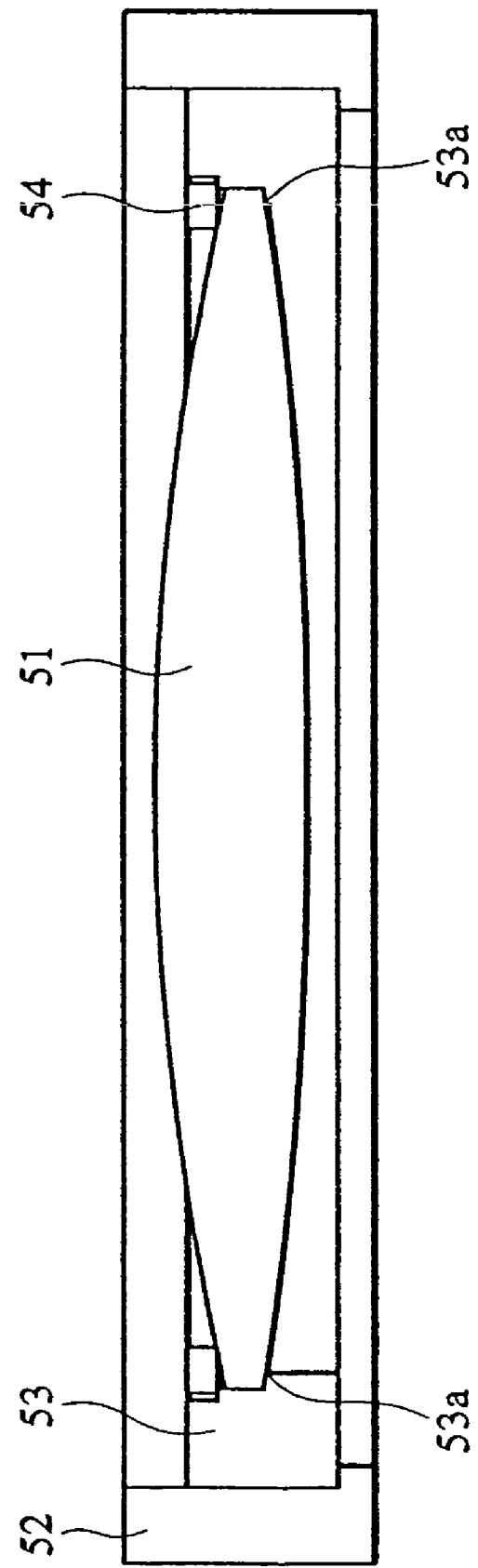
FIG. 7 is a side sectional view of a conventional lens holding structure using a junk ring.
Figure 8:
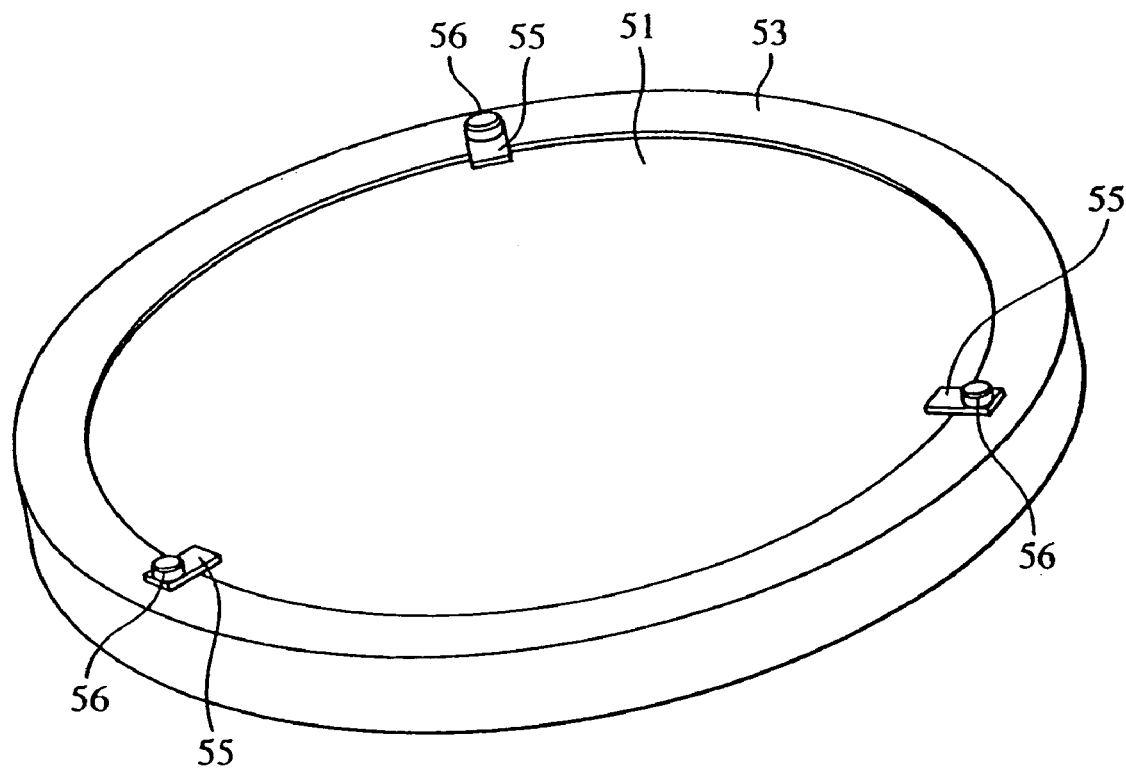
FIG. 8 is a side sectional view of a conventional lens holding structure using a presser plate.

FIG. 6 illustrates an embodiment in which the optical unit described in the aforementioned first to third embodiments is applied to a semiconductor exposure unit, schematically showing the exposure unit.

In FIG. 6 illuminating light from a lighting (illuminating) optical system 92 is irradiated onto a portion of a reticle 90 mounted on a reticle stage 91. A light source (not shown) built in the illuminating optical system 92 is, for example, a KrF excimer laser having an oscillation wavelength of about 248 nm, an ArF excimer laser having an oscillation wavelength of about 193 nm, or an F2 excimer laser having an oscillation wavelength of about 157 nm.

The reticle 90 irradiates through the illuminating optical system 92 a part of a pattern area drawn on the reticle in a slit shape. The pattern corresponding to this slit portion is reduced in size to a prescribed magnification (for example, ¼ or ⅕) by a projection optical system 93, and projected in a reduced size onto a wafer 95 having a photosensitive material coated on the surface thereof, mounted on a wafer stage 94.

The projection optical system 93 is mounted on a frame 96 of the exposure unit. The above-mentioned optical unit is used in this projection optical system 93. In the projection optical system 93, lens holding bases are arranged in a plurality of stages in the enclosure of the optical unit, and a lens is held by the lens holding base of each stage by the method described in the first to third embodiments.

By scanning the reticle 90 and the wafer 95 relative to the projection optical system 93, it is possible to transfer a pattern area of the reticle 90 onto the photosensitive material on the wafer 95. This scanning exposure is carried out repeatedly onto a plurality of transfer areas (shots) on the wafer 95.

The projection optical system 93 is required to have a high resolution, and a highly accurate lens holding method is demanded. By holding the lens by the method described in the first to third embodiments, therefore, a high and stable resolution of the projection optical system 93 is obtained.

This embodiment has covered the step-and-scan type exposure unit which conducts scanning exposure while synchronizing the reticle with the wafer and sequentially transferring to the next shot. The optical unit of the present invention is however applicable also to exposure units other than the exposure unit of this type. For example, the exposure unit may be of the step-and-repeat type performing stepwise movement while sequentially printing reticle patterns, known as the stepper type.

Any of the refraction-type projection optical systems employing a plurality of lenses, the reflect-refraction optical system using a lens and a reflecting surface, and the reflex-type optical system composed of only a reflecting surface is applicable as the projection optical system. The present invention is applicable to at least one of the component elements of these types of projection optical system, such as a lens, a parallel flat glass plate, a prism, a mirror, and a binary optics.

A mercury lamp which irradiates light from a g-line (wavelength: 436 nm) or an i-line (wavelength: 365 nm) light source may be used as the lighting optical system.

This embodiment is applicable also to a manufacturing method of a device using the above-mentioned exposure unit. Such a device manufacturing method comprises the steps of exposing a wafer (object to be exposed) by the exposure unit of this embodiment, developing the exposed wafer (object of exposure), and other publicly known steps.

According to this embodiment, as described above, an optical element is held by bringing an element holding member into contact with a holding surface formed as a surface different from the optical surface on the optical element. It is therefore possible to inhibit elastic deformation of the optical surface which may affect the optical performance caused by the holding structure itself of the optical element. A change in the amount of the optical surface caused by the difference in the amount of expansion/shrinkage of the members resulting from a state of assembly or a change in temperature can be minimized. This makes it possible to achieve an optical unit giving stable optical performance, and moreover, an exposure unit or an optical device mounting the same. It is furthermore possible to achieve a device manufacturing method using such an exposure unit.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An optical unit comprising:
    an optical element having on a periphery a concavity with two opposing surfaces different from a surface to be illuminated;
    an annular base provided along the periphery of said optical element; and
    a holding mechanism provided on said annular base, said holding mechanism comprising a first holding member having a flat surface pressing against one of the two opposing surfaces and a second holding member having a flat surface pressing against the other of the two opposing surfaces, said first holding member and said second holding member being fastened by a bolt for adjusting the distance between said first holding member and said second holding member.

2. An optical unit according to claim 1, wherein said optical element has three said concavities and said holding mechanism holds each of said concavities.

3. An optical unit according to claim 1, wherein said optical element has three said concavities and said annular base has a holding member for holding the weight of said optical element at each of said concavities.

4. An optical unit according to claim 1, wherein each of said two opposing surfaces is parallel to an optical axis.

5. An exposure apparatus comprising:
    a light source; and
    a projection optical system for projecting a pattern of an original on a substrate by using light from said light source,
    wherein said projection optical system comprises said optical unit according to claim 1.

* * * * *

UNITED STATES PATENT AND TRADEMARK OFFICE
CERTIFICATE OF CORRECTION

PATENT NO. : 7,184,227 B2
APPLICATION NO. : 11/398592
DATED : February 27, 2007
INVENTOR(S) : Setsuo Yoshida It is certified that error appears in the above-identified patent and that said Letters Patent is hereby corrected as shown below:

COLUMN 1:
Line 5, "7,050,347 B2" should read --7,050,247 B2--.
Line 43, "are" should read --is--.

COLUMN 7:
Line 15, "adhesion" should read --adhesive--.
Line 19, "a play o" should read --play of--.

COLUMN 8:
Line 30, "a" (4th occurrence) should be deleted.

Signed and Sealed this

Tenth Day of March, 2009

JOHN DOLL
*Acting Director of the United States Patent and Trademark Office*